US007228522B2

(12) United States Patent
Beale

(10) Patent No.: US 7,228,522 B2
(45) Date of Patent: Jun. 5, 2007

(54) EDGE-BASED PROXIMITY CORRECTION

(75) Inventor: Daniel Beale, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 46 days.

(21) Appl. No.: 11/139,390

(22) Filed: May 27, 2005

(65) Prior Publication Data
US 2006/0080634 A1   Apr. 13, 2006

Related U.S. Application Data

(63) Continuation-in-part of application No. 10/955,189, filed on Sep. 29, 2004, and a continuation-in-part of application No. 10/955,532, filed on Sep. 29, 2004.

(60) Provisional application No. 60/657,796, filed on Mar. 2, 2005.

(51) Int. Cl.
*G06F 17/50* (2006.01)

(52) U.S. Cl. .............................. 716/19; 716/20; 716/21; 703/2

(58) Field of Classification Search .................... 716/4, 716/2, 8, 11, 19–21; 382/145
See application file for complete search history.

(56) References Cited

U.S. PATENT DOCUMENTS

| 6,077,310 | A  | * | 6/2000  | Yamamoto et al. ........... 716/19 |
| 6,243,855 | B1 | * | 6/2001  | Kobayashi et al. ........... 716/19 |
| 6,668,367 | B2 | * | 12/2003 | Cobb et al. ................... 716/19 |
| 6,763,514 | B2 | * | 7/2004  | Zhang .......................... 716/19 |
| 6,817,003 | B2 | * | 11/2004 | Lippincott et al. ............. 716/8 |
| 6,868,175 | B1 | * | 3/2005  | Yamamoto et al. ......... 382/145 |
| 7,003,756 | B2 | * | 2/2006  | Zhang .......................... 716/19 |
| 7,010,776 | B2 | * | 3/2006  | Gallatin et al. ............... 716/19 |
| 7,024,638 | B2 | * | 4/2006  | Scheffer et al. ................. 716/2 |
| 7,024,655 | B2 | * | 4/2006  | Cobb .......................... 716/19 |
| 2003/0061587 | A1 | * | 3/2003 | Zhang et al. ................. 716/11 |

* cited by examiner

*Primary Examiner*—Jack Chiang
*Assistant Examiner*—Nghia M. Doan
(74) *Attorney, Agent, or Firm*—Park, Vaughan & Fleming, LLP

(57) ABSTRACT

One embodiment of the present invention provides a system that calculates an edge-based proximity correction which is applied to a region in the proximity of an evaluation point. During operation the system receives a layout. Next, the system decomposes polygons in the layout into edges. The system then computes the edge-based proximity correction based on the contributions of the edges. Specifically, the system computes contributions of the edges by: representing an edge as a difference between a first line-segment and a second line-segment which overlap at all points except for the points on the edge; determining a first pre-computed value that represents the first line-segment's contribution to the edge-based proximity correction; determining a second pre-computed value that represents the second line-segment's contribution to the edge-based proximity correction; and determining the contribution of the edge based on the difference between the first pre-computed value and the second pre-computed value.

14 Claims, 4 Drawing Sheets

EDGE-BASED PROXIMITY CORRECTION

RELATED APPLICATION

This application is a continuation-in-part of, and hereby claims priority under 35 U.S.C. § 120 to, U.S. patent application Ser. No. 10/955,189, entitled, "CALCULATING ETCH PROXIMITY-CORRECTION USING IMAGE-PRECISION TECHNIQUES," by inventors Dan Beale, Jim Shiely, and John Stirniman, filed on 29 Sep. 2004. This application is also a continuation-in-part of, and hereby claims priority under 35 U.S.C. § 120 to, U.S. patent application Ser. No. 10/955,532, entitled, "CALCULATING ETCH PROXIMITY-CORRECTION USING OBJECT-PRECISION TECHNIQUES," by inventors Dan Beale, Jim Shiely, and John Stirniman, filed on 29 Sep. 2004. Furthermore, this application claims priority under 35 U.S.C. §119 to U.S. Provisional Patent Application No. 60/657,796, filed on 2 Mar. 2005, entitled "High Speed Edge-Based Proximity Correction Algorithm," by inventors Daniel Beale, James Shiely, and John P. Stirniman.

BACKGROUND

1. Field of the Invention

This invention relates to semiconductor manufacturing processes. More specifically, the invention relates to a method and an apparatus for computing edge-based proximity correction.

2. Related Art

Dramatic improvements in semiconductor integration densities have largely been achieved because of corresponding improvements in semiconductor manufacturing technologies.

Semiconductor manufacturing technologies typically include a number of processes which involve complex physical and chemical interactions. Since it is almost impossible to find exact analytical formulae to predict the behavior of these complex interactions, researchers typically use statistical models.

Once statistical models are found, they are often used to make corrections to layouts to compensate for undesirable effects of a semiconductor manufacturing process. Note that corrections are typically computed based on nearby features using proximity correction techniques. Furthermore, note that these proximity correction techniques can be used for any semiconductor manufacturing process whose effect can be predicted (or simulated) using statistical models.

For example, optical proximity correction techniques typically compensate for the idiosyncrasies of a lithography process by correcting the feature shapes of a mask. The corrected mask can then be used to generate the desired feature shapes on the wafer.

Present proximity correction techniques typically use linear convolution. In linear convolution, a correction is computed by linearly superimposing contributions from neighboring polygons, wherein a polygon's contribution is typically computed by convolving a statistical model with the polygon. Note that, although linear-convolution based techniques account for the distance of polygons from the evaluation point, they are largely insensitive to the specific positioning of polygons relative to one another.

Unfortunately, the effects of many semiconductor manufacturing processes directly depend on the relative positions of these polygons. Note that, at large feature dimensions, linear-convolution based proximity correction techniques are sufficiently accurate. But, as semiconductor integration densities continue to increase at an exponential rate, it is becoming progressively harder to use linear-convolution based techniques to accurately predict and correct undesirable effects of semiconductor manufacturing processes.

Hence what is needed is an accurate and efficient technique to compute proximity correction for semiconductor manufacturing processes, especially when the proximity effects depend (partially or fully) on the relative positions of polygons.

SUMMARY

One embodiment of the present invention provides a system that calculates an edge-based proximity correction which is applied to a region in the proximity of an evaluation point. During operation the system receives a layout. Next, the system decomposes polygons in the layout into edges. Next, the system computes the edge-based proximity correction based on the contributions of the edges.

In a variation on this embodiment, the system computes contributions of the edges by: representing an edge as a difference between a first line-segment and a second line-segment which overlap at all points except for the points on the edge; determining a first pre-computed value that represents the first line-segment's contribution to the edge-based proximity correction; determining a second pre-computed value that represents the second line-segment's contribution to the edge-based proximity correction; and determining the contribution of the edge by computing the difference between the first pre-computed value and the second pre-computed value. Note that, in one embodiment, a line-segment can be a semi-infinite ray.

In a variation on this embodiment, the system receives an interaction region around an evaluation point which identifies a region that contains edges that may have non-negligible contributions to the edge-based proximity correction computation. The system then selects a set of visible edges within the interaction range which are visible from the evaluation point, wherein the edge-based proximity correction is computed using the set of visible edges, instead of all the edges within the interaction range.

In a variation on this embodiment, the system pre-computes line-segment contributions by: receiving an integrand which models an effect of a semiconductor manufacturing process for which the edge-proximity correction is being computed; generating a reference line-segment; computing a contribution value based on the integrand and the reference line-segment, wherein the contribution value represents the reference line-segment's contribution to the edge-proximity correction; and associating the reference line-segment with the contribution value, thereby allowing a subsequent execution of an edge-based proximity correction process to quickly lookup the reference line-segment's pre-computed contribution value.

In a further variation on this embodiment, the system computes the contribution value of the reference line-segment by computing a line integral of the integrand along the reference line-segment.

In a further variation on this embodiment, the system computes the contribution value of the reference line-segment by computing a surface integral of the integrand over an area shadowed by the reference line-segment.

In a variation on this embodiment, the edge-based proximity correction can be used for correcting effects of semiconductor manufacturing processes including photolithography, etch, chemical-mechanical polishing (CMP), trench fill, or reticle manufacture.

DETAILED DESCRIPTION

Integrated Circuit Design and Fabrication

Figure 1:
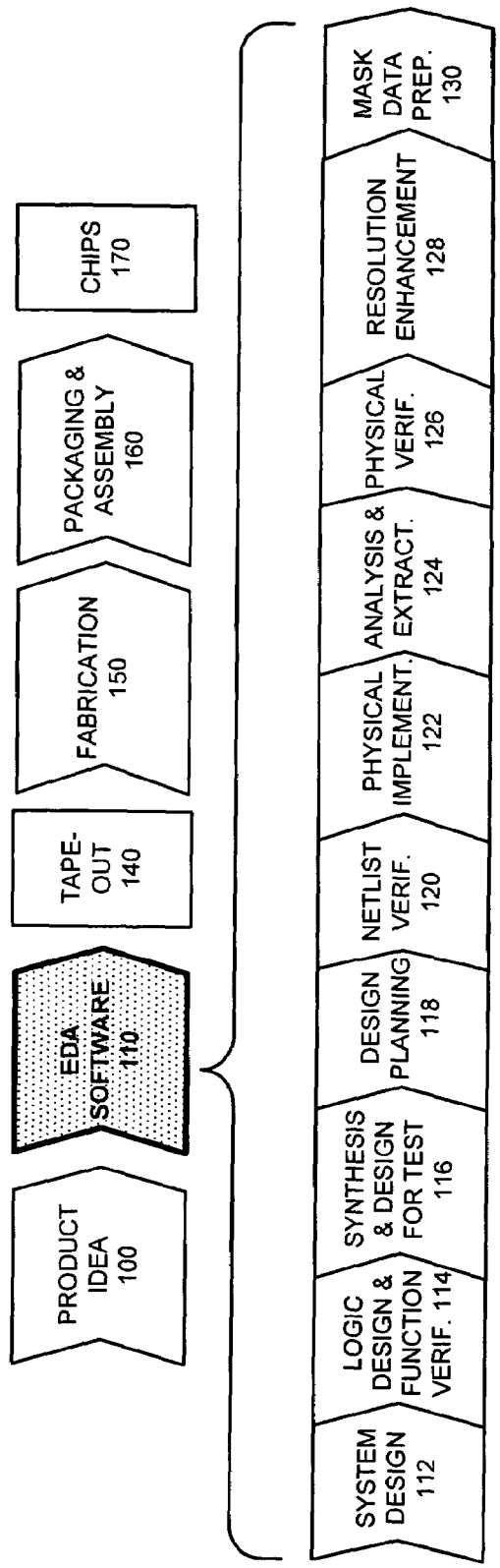
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention. The process starts with a product idea (step 100). Next, the product idea is realized using an integrated circuit, which is designed using Electronic Design Automation (EDA) software (step 110). Once the circuit design is finalized, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), physical verification (step 126), resolution enhancement (step 128), and mask data preparation (step 130).

Note that embodiments of the present invention can be used during one or more of the above described steps. Specifically, one embodiment of the present invention can be used during the resolution enhancement step 128.

Proximity Correction

Figure 2A:
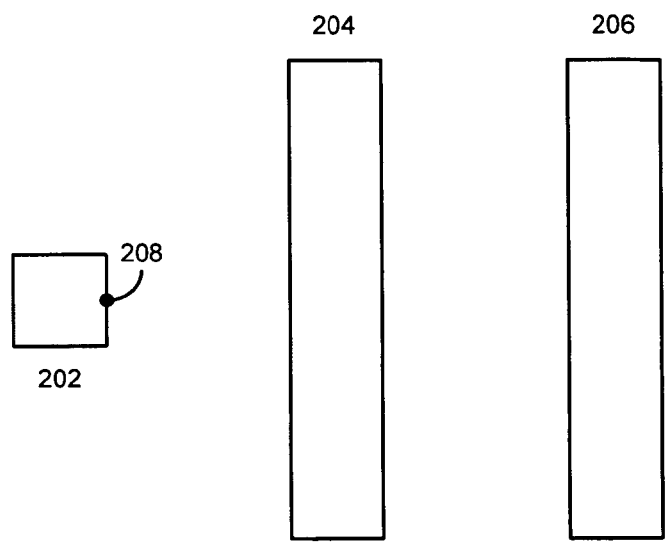
FIGS. 2A and 2B illustrate how present proximity correction techniques, which use linear convolution to compute a correction, fail to consider the relative position of polygons in accordance with an embodiment of the present invention.
Figure 2B:
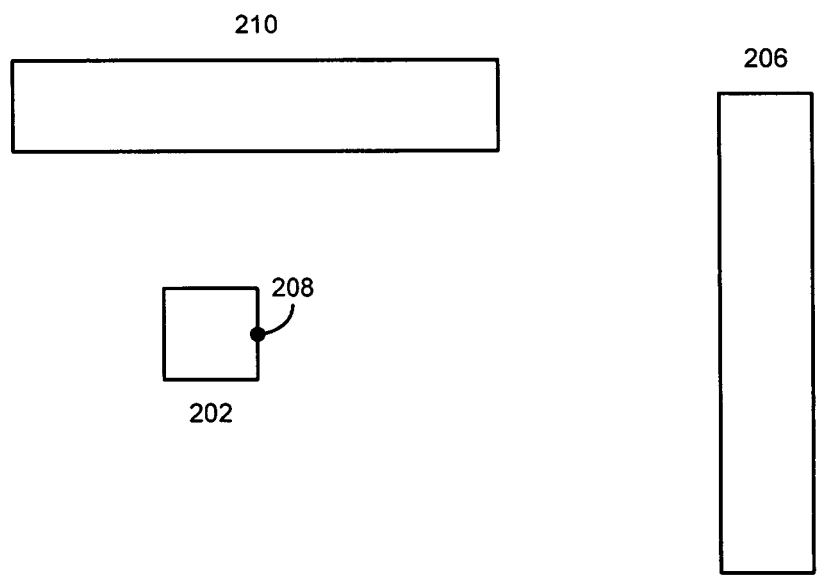

FIGS. 2A and 2B illustrate how present proximity correction techniques, which use linear convolution to compute a correction, fail to consider the relative position of polygons in accordance with an embodiment of the present invention.

FIG. 2A illustrates a portion of a layout containing polygons 202, 204, and 206. Note that the proximity correction at evaluation point 208 on polygon 202 is typically computed by superimposing contributions from polygons 204 and 206.

FIG. 2B illustrates a portion of a layout that is essentially the same as FIG. 2A, except that polygon 204 has been replaced by polygon 210, which is a rotated version of polygon 204. Furthermore, note that polygon 210 has been positioned so that the distance between a point on polygon 210 and evaluation point 208 is the same as the distance between a corresponding point on polygon 204 and evaluation point 208. Consider the case in which the proximity effect at the evaluation point depends on the trench width, which corresponds to the open area visible from the evaluation point. In FIG. 2A, polygon 206 makes no contribution to the area visible from the evaluation point because it is occluded by polygon 204. On the other hand, polygon 206 may make a substantial contribution to the open area visible from the evaluation point. Present linear-convolution based techniques cannot model this behavior, namely, that polygon 206 makes no contribution to the proximity effect in FIG. 2A, but does contribute in FIG. 2B. This is because linear-convolution based techniques typically superimpose the individual contributions of neighboring polygons. Hence, in a linear-convolution based approach, polygon 206 would have the same contribution in FIG. 2A as in FIG. 2B.

Unfortunately, the effects of many semiconductor manufacturing processes directly depend on the relative positions of these polygons. As a result, the correct proximity correction at evaluation point 208 may be very different for the layouts shown in FIG. 2A and FIG. 2B. In such situations, it can be very difficult (if not impossible) to use present proximity correction techniques to accurately model and compensate for undesirable effects of semiconductor manufacturing processes.

For example, etch proximity-effects are heavily influenced by the relative positions of polygons in a layout. Specifically, one of the important sources for etch proximity-effects is the deposition of passivant molecules during etch processing. Since the pressure in the etch chamber is very low, these molecules usually move in straight lines, i.e. collisionlessly, through the gas phase. Furthermore, passivant molecules typically have a high sticking coefficient. As a result, they deposit preferentially on sidewalls adjacent to wide trench areas. In contrast, the transport of passivant molecules into dense features is limited. Due to these reasons, the positioning of polygons in the layout plays a critical role in determining etch-proximity effects. Consequently, linear convolution based proximity correction techniques are not suitable for compensating etch-proximity effects.

Furthermore, such proximity effects are not limited to only etch processes. For example, photolithography typically involves many physical and chemical processes, including resist bake and diffusion of photoactive compounds. Hence, photolithography can also exhibit proximity effects that cannot be accounted for by simply superimposing electric field contributions.

Note that, even if the proximity model contains terms that compute the effect of interference between multiple polygons, it is unlikely that the model will be able to accurately model the effect of the specific positioning of polygons relative to one another.

Edge-Based Proximity Correction

One embodiment of the present invention performs edge-based proximity correction, which overcomes the shortcomings of present proximity correction techniques by taking into account the specific positioning of polygons within the layout. Specifically, edge-based proximity correction can perform calculations based on edges that are visible from an evaluation point. Note that present proximity correction techniques typically account for all polygons that are within a specified interaction range (ambit). Consequently, present proximity correction techniques compute a polygon's contribution even if it is not visible from the evaluation point.

Edge-based proximity correction techniques typically begin by dissecting polygons in the layout into edges. Next, the system selects a set of edges for computing the proximity correction. It will be apparent that a number of criteria can be used to select the set of edges. Specifically, in one embodiment, the system selects only those edges that are within an interaction region (or range). Furthermore, the system can further whittle down the set of edges by removing occluded edges.

Once the system determines a set of edges, it can then compute a proximity correction based on these edges. Note that edge-based proximity correction can be used in conjunction with other proximity correction techniques. For example, in one embodiment, an edge-based proximity correction technique can be used to compute only some of the terms of a proximity correction model.

Note that, based on the above discussion, it will be apparent to one skilled in the art that standard linear-convolution based technique could be used on a subset of the pattern, for example by using linear-convolution to estimate proximity contributions only of polygons that are visible from an evaluation point. Although this enhancement may account for proximity effects that are dependent on the relative positions of the polygons, it may not be as accurate or as fast as the edge-based techniques disclosed in the instant application. Specifically, one embodiment can correct a layout using either the above-described enhancement to standard linear-convolution based techniques or the edge-based techniques described in the instant application, or a combination thereof.

In one embodiment, the system calculates the proximity correction by computing a surface integral of a statistical function over the areas shadowed by the set of edges. Particularly, the statistical function can be inversely proportional to the radial distance from the evaluation point. Specifically, in one embodiment, the statistical function, $f$, is defined as $f(r, \theta)=a/r$, where $(r,\theta)$ are the polar coordinates with respect to the evaluation point, and a is a free parameter that is chosen so that a surface integral of the statistical function accurately models the semiconductor manufacturing process in question.

In another embodiment of the present invention, the statistical function, $f$, is a Gaussian function, which is defined as $f(r,\theta)=ae^{-(r/b)^2}$, where $(r, \theta)$ are the polar coordinates with respect to the evaluation point, and a, b are free parameters that are chosen so that a surface integral of the statistical function accurately models the semiconductor manufacturing process in question.

Alternatively, the system can calculate the edge-based proximity correction by computing a line integral of a statistical fitting function over the set of edges. Specifically, in one embodiment, the line integral is calculated over only on the visible portion of an edge in the set of edges.

Furthermore, if the statistical function is Gaussian, the line integral can be efficiently calculated as the difference of two error functions multiplied by an exponential. For example, if the statistical function is $K(x,y)=e^{-(x^2+y^2)/\sigma^2}$, the value of the line integral evaluated over a vertical edge from $(x_0,y_0)$ to $(x_0,y_1)$ is equal to $$\frac{\sqrt{\pi}}{\sigma/2} \cdot e^{-x_0^2/\sigma^2} \cdot \left(erf\left(\frac{y_0}{\sigma}\right) - erf\left(\frac{y_1}{\sigma}\right)\right).$$

Note that, in the above expression, $erf(x)$ represents the error function.

High Speed Edge-Based Proximity Correction

Computing an edge-based proximity correction for a full chip can be computationally intensive because it usually involves computing complex 2-D integrals for a substantially large number of edges. Hence, we need a technique for speeding up such computations.

One embodiment of the present invention provides a technique for substantially speeding up computations for edge-based proximity correction. Specifically, the system begins by representing each edge by two semi-infinite rays. Next, the system determines the contribution of each ray using 2-D lookup tables. The system then computes the contribution of the edge by computing the difference between the contributions of the two rays associated with the edge.

Note that the 2-D lookup tables can contain pre-computed surface integrals or line-integrals depending on the statistical model being used.

For example, for models which depend on open area visible from the evaluation point, the 2-D lookup table can contain a pre-computed surface integral over the area within the interaction range that is shadowed by a semi-infinite ray.

Alternatively, for models which depend on line integrals over visible edges, the 2-D lookup table can contain a pre-computed line integral over a semi-infinite ray within the interaction range.

FIGS. 3A, 3B, 3C, 3D, and 3E illustrate how a 2-D lookup table can be used to speed up edge-based proximity correction computations in accordance with an embodiment of the present invention.

Figure 3A:
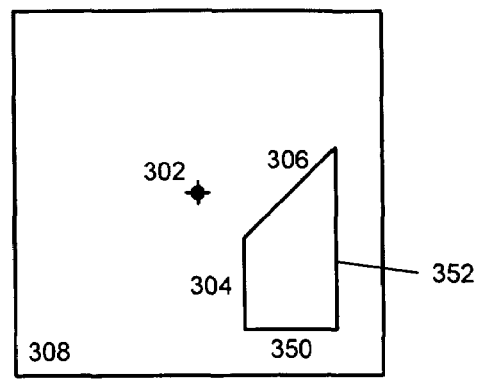
FIGS. 3A, 3B, 3C, 3D, and 3E illustrate how a 2-D lookup table can be used to speed up edge-based proximity correction computations in accordance with an embodiment of the present invention.

FIG. 3A illustrates a polygon with edges 304, 306, 350, and 352 within interaction range 308 of evaluation point 302.

Note that a system can first use a visual surface determination technique to determine that edges 350 and 352 are not visible from the evaluation point. The system may decide not to use these edges in the edge-based proximity correction computation. Hence, in one embodiment, the system only computes the edge-based proximity correction based on visible edges, namely, edges 304 and 306.

Figure 3B:
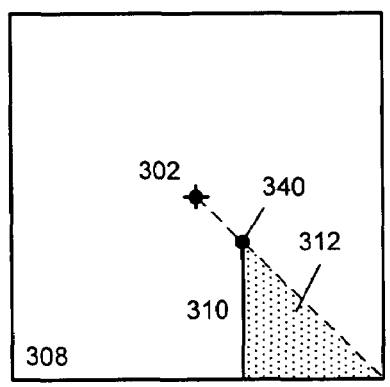
Figure 3C:
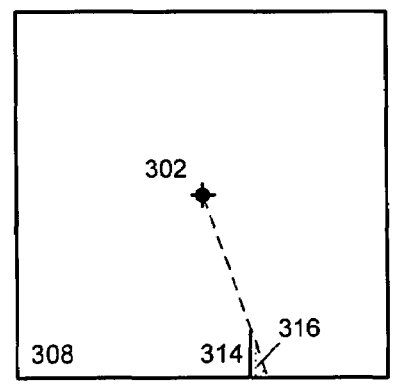

FIGS. 3B and 3C illustrate how a system can compute edge 304's contribution to the edge-based proximity correction. (The following discussion is based on a statistical model that computes a surface integral of the area shadowed by an edge. It will be apparent to one skilled in the art that a similar process can be used when the statistical model computes a line integral over the edge.)

Specifically, the system first represents edge 304 as a difference between line-segments 310 and 314. Next, the system looks up a pre-computed surface integral value over area 312 which is shadowed by line-segment 310. The system also looks up a pre-computed surface integral value over area 316 which is shadowed by line-segment 314. Note that the area shadowed by edge 304 is equal to the difference between the areas shadowed by line-segments 310 and 314. As a result, the system can compute the value of the surface integral over the area shadowed by edge 304 by simply subtracting the pre-computed surface integral value over area 316 from the pre-computed surface integral value over area 312. Note that since these surface integral values are pre-computed, the surface integral computation over the area shadowed by edge 304 can be performed very quickly.

Figure 3D:
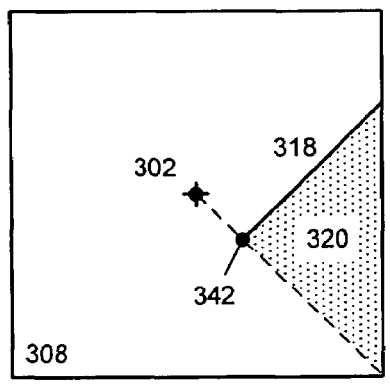
Figure 3E:
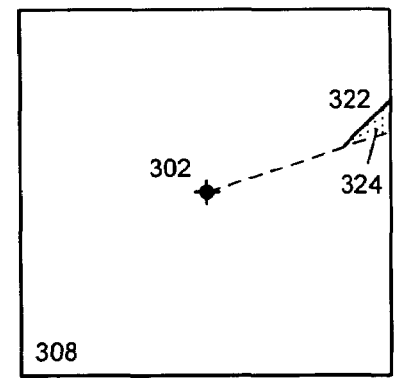

FIGS. 3D and 3E similarly illustrate how the system can compute edge 306's contribution to the edge-based proximity correction. The system represents edge 306 as a difference between line-segments 318 and 322. Next, the system looks up a pre-computed surface integral value over area 320 which is shadowed by line-segment 318. The system also looks up a pre-computed surface integral value over area 324 which is shadowed by line-segment 322. Note that, as before, the area shadowed by edge 306 is equal to the difference between the areas shadowed by line-segments 318 and 322. Consequently, the system can compute the value of the surface integral over the area shadowed by edge 306 by simply subtracting the pre-computed surface integral value over area 324 from the pre-computed surface integral value over area 320. Again, since these surface integral values are pre-computed, the surface integral computation over the area shadowed by edge 306 can be performed very quickly.

Note that the pre-computed integral values can be stored in a 2-D lookup table that is indexed by the base of the line-segment. For example, line-segment 310 can be identified by its base 340. Similarly, line-segment 318 can be identified by its base 342. (Note that, since one end of the line-segment is always at the boundary of the interaction region, each line-segment can be uniquely identified using its base, i.e., the end of the line-segment which is within the interaction region.)

Furthermore, note that the 2-D table can be pre-computed for each different face angle. For example, if the allowed polygon face angles are 0, 45, 90 and 135 degrees then four ray tables can be pre-computed. (Note that if base coordinates in all four quadrants are included in the tables, there is no need for additional tables, e.g. for −45 degrees or −90 degrees.)

Additionally, note that the pre-computed values are typically stored for a number of line segments forming a grid. If the base of a line-segment does not directly match a stored value, the system may need to use interpolation techniques to determine the value of the line-segment's contribution. Note that the system can use a number of interpolation techniques. Specifically, in one embodiment the system uses linear interpolation to determine surface integral values for line-segments whose base does not return a direct hit during the 2-D table lookup.

In summary, one embodiment of the present invention can reduce the time-consuming 2-D integration to four table lookups, interpolations over the lookup table grid and a few arithmetic operations. This novel optimization can make visible area and visible edge calculations fast enough for use in full-chip proximity correction models.

Process of Calculating Edge-Based Proximity Correction

Figure 4:
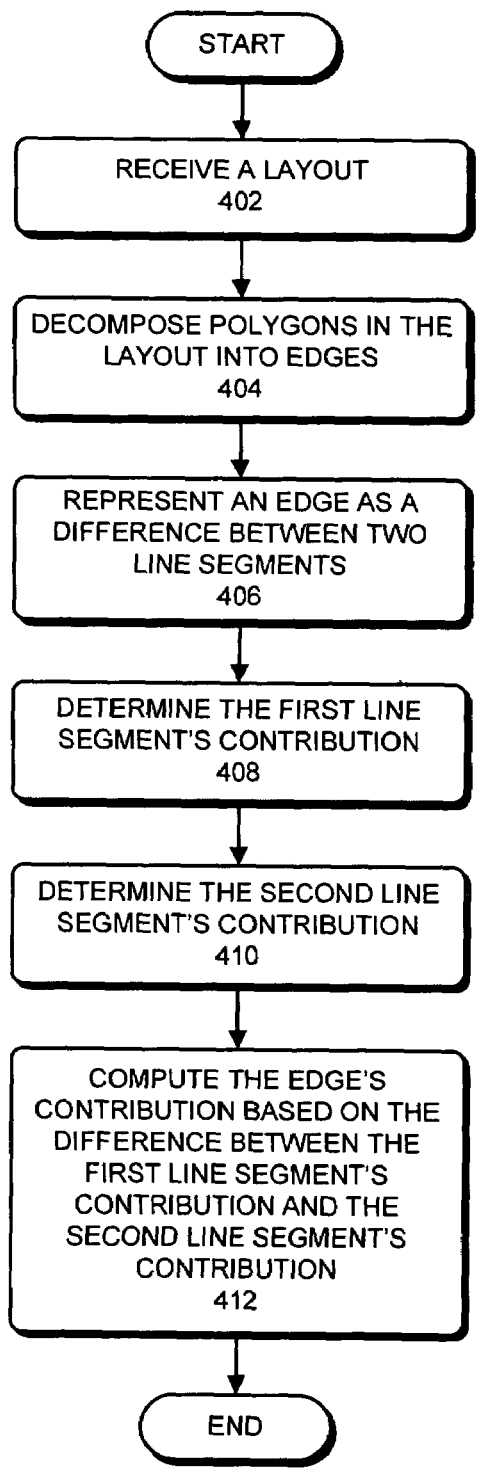
FIG. 4 presents a flowchart that illustrates a process of calculating edge-based proximity correction in accordance with an embodiment of the present invention.

FIG. 4 presents a flowchart that illustrates a process of calculating edge-based proximity correction in accordance with an embodiment of the present invention.

The process typically begins by receiving a layout (step 402).

Next, the system decomposes polygons in the layout into edges (step 404). Note that the system can use a number of techniques for decomposing polygons into edges. Furthermore, the system can use a variety of data structures to store geometric entities such as polygons, edges, and line-segments. Specifically, in one embodiment the system uses binary space partitioning trees to store geometric entities.

The system then computes the contributions of the edges to the edge-based proximity correction.

In one embodiment, the system computes the contributions of all edges within an interaction region around an evaluation point. The interaction region identifies a region that contains edges that have non-negligible contributions to the edge-based proximity correction computation. Specifically, in one embodiment, the interaction region is specified using an interaction range which indicates a distance from the evaluation point beyond which edges are considered to have a negligible contribution.

Furthermore, the system can compute the edge-based proximity correction based on only those edges within the interaction region which are visible from the evaluation point. Note that the system can use a number of visual surface determination techniques to determine the set of visible edges.

Specifically, the system can use image-precision techniques for determining edges that are visible from the evaluation point. Image-precision techniques typically operate by casting a number of rays from the evaluation point. Next, the cast rays are allowed to extend until they either intersect an edge of a neighboring polygon, or they reach the end of the interaction region. In this manner, the system can determine the visible edges within the interaction region.

Alternatively, the system can use object-precision techniques for determining visible edges. Object precision techniques usually perform calculations at the precision at which objects are defined. Note that, object-precision techniques can be more accurate than image-precision techniques because they typically do not suffer from inaccuracies that can arise in image-precision techniques because of using inadequate number of sampling rays. Examples of object precision techniques include back-face culling and use of a binary space partition tree to determine visibility.

Continuing with the flowchart of FIG. 4, the system then computes a contribution of an edge to the edge-based proximity correction.

Specifically, the system represents an edge as a difference between two line segments (step 406). Note that, in one embodiment, a line segment can be a semi-infinite ray.

Next, the system determines the first line-segment's contribution to the edge-based proximity correction (step 408).

The system then determines the second line-segment's contribution to the edge-based proximity correction (step 410).

In one embodiment, the system determines the line-segment contributions by looking up pre-computed values that represents the line-segment contributions.

Specifically, the system can store the pre-computed values in a 2-D table by first receiving an integrand which models an effect of a semiconductor manufacturing process for which the edge-proximity correction is being computed. Next, the system generates a grid of reference line-segments. Note that the system can generate multiple grids, each for a specific face angle. The system then computes a contribution value based on the integrand and the reference line-segment, wherein the contribution value represents the reference line-segment's contribution to the edge-proximity correction. Note that the system can use surface integrals, line integrals or any other mathematical technique for computing the contribution of the line segments. Next, the system associates a reference line-segment with the contribution value, thereby allowing a subsequent execution of an edge-based proximity correction process to quickly lookup the reference line-segment's pre-computed contribution value.

Continuing with the flowchart of FIG. 4, the system then determines the edge's contribution based on the difference between the first line-segment's contribution and second line-segment's contribution (step 412).

Once the system determines all relevant edge contributions, it then computes the edge-based proximity correction based on the edge contributions. Note that it will be apparent to one skilled in the art that a number of techniques and/or formulae can be used to compute the edge-based proximity correction based on the edge contributions. Specifically, in one embodiment, the system adds all the edge contributions and subtracts the sum from the surface integral over the whole interaction range. The system then uses the result of the subtraction to compute the edge-based proximity correction.

Note that embodiments of the present invention can determine the contribution of an edge substantially faster than other techniques that rely on computing 2-D integrals. This is because embodiments of the present invention store pre-computed contributions of line-segments in a 2-D table, and then, during execution, quickly compute an edge's contribution by representing the edge as a difference between two line-segments (or semi-infinite rays), and by looking up the line-segment contributions from the 2-D table.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art.

For example, although the above disclosure describes statistical models that compute surface integrals and line integrals, it will be apparent that a variety of mathematical techniques can be used to compute the effects of a semiconductor manufacturing process. Note that, regardless of the mathematical techniques used, embodiments of the present invention can be used to speed up edge-based proximity correction as long as the contribution of an edge can be computed using the difference between the contributions of the corresponding line-segments (or semi-infinite rays).

Additionally, the above disclosure is not intended to limit the present invention. The scope of the present invention is defined by the appended claims.

What is claimed is:

1. A method for calculating an edge-based proximity correction which is applied to a region in the proximity of an evaluation point, the method comprising:
   receiving a layout;
   decomposing polygons in the layout into edges;
   representing an edge as a difference between a first line-segment and a second line-segment which overlap at all points except for the points on the edge;
   computing the edge's contribution to the edge-based proximity correction using the first line-segment and the second line-segment;
   computing the edge-based proximity correction using the edge's contribution;
   receiving an interaction region around the evaluation point which identifies a region that contains edges that have non-negligible contributions to the edge-based proximity correction computation;
   selecting a set of visible edges within the interaction range which are visible from the evaluation point, wherein the edge-based proximity correction is computed using the set of visible edges, instead of all the edges within the interaction range;
   receiving an integrand which models an effect of a semiconductor manufacturing process for which the edge-proximity correction is being computed;
   generating a reference line-segment;
   computing a contribution value based on the integrand and the reference line-segment, wherein the contribution value represents the reference line-segment's contribution to the edge-proximity correction; and
   associating the reference line-segment with the contribution value, thereby allowing a subsequent execution of an edge-based proximity correction process to quickly lookup the reference line-segment's pre-computed contribution value.

2. The method of claim 1, wherein computing the edge's contribution involves:
   determining a first pre-computed value that represents the first line-segment's contribution to the edge-based proximity correction;
   determining a second pre-computed value that represents the second line-segment's contribution to the edge-based proximity correction; and
   determining the edge's contribution using the difference between the first pre-computed value and the second pre-computed value.

3. The method of claim 1, wherein a line-segment is a semi-infinite ray.

4. The method of claim 1, wherein computing the contribution value involves computing a line integral of the integrand along the reference line-segment.

5. The method of claim 1, wherein computing the contribution value involves computing a surface integral of the integrand over an area shadowed by the reference line-segment.

6. The method of claim 1, wherein the edge-based proximity correction can be used for correcting effects of semiconductor manufacturing processes which include:
   photolithography;
   etch;
   chemical-mechanical polishing (CMP);
   trench fill; or
   reticle manufacture.

7. A computer-readable storage medium storing instructions that when executed by a computer cause the computer to perform a method for calculating an edge-based proximity correction which is applied to a region in the proximity of an evaluation point, the method comprising:
   receiving a layout;
   decomposing polygons in the layout into edges;
   representing an edge as a difference between a first line-segment and a second line-segment which overlap at all points except for the points on the edge;
   computing edge's contribution to the edge-based proximity correction using the first line-segment and the second line-segment;
   computing the edge-based proximity correction using the edge's contribution;
   receiving an interaction region around the evaluation point which identifies a region that contains edges that have non-negligible contributions to the edge-based proximity correction computation;
   selecting a set of visible edges within the interaction range which are visible from the evaluation point, wherein the edge-based proximity correction is computed using the set of visible edges, instead of all the edges within the interaction range;

receiving an integrand which models an effect of a semiconductor manufacturing process for which the edge-proximity correction is being computed;

generating a reference line-segment;

computing a contribution value based on the integrand and the reference line-segment, wherein the contribution value represents the reference line-segment's contribution to the edge-proximity correction; and associating the reference line-segment with the contribution value, thereby allowing a subsequent execution of an edge-based proximity correction process to quickly lookup the reference line-segment's pre-computed contribution value.

8. The computer-readable storage medium of claim 7, wherein computing the edge's contribution involves:

determining a first pre-computed value that represents the first line-segment's contribution to the edge-based proximity correction;

determining a second pre-computed value that represents the second line-segment's contribution to the edge-based proximity correction; and determining the edge's contribution using the difference between the first pre-computed value and the second pre-computed value.

9. The computer-readable storage medium of claim 7, wherein a line-segment is a semi-infinite ray.

10. The computer-readable storage medium of claim 7, wherein computing the contribution value involves computing a line integral of the integrand along the reference line-segment.

11. The computer-readable storage medium of claim 7, wherein computing the contribution value involves computing a surface integral of the integrand over an area shadowed by the reference line-segment.

12. The computer-readable storage medium of claim 7, wherein the edge-based proximity correction can be used for correcting effects of semiconductor manufacturing processes which include:

photolithography;

etch;

chemical-mechanical polishing (CMP);

trench fill; or reticle manufacture.

13. An apparatus for calculating an edge-based proximity correction which is applied to a region in the proximity of an evaluation point, the apparatus comprising:

a layout-receiving mechanism configured to receive a layout;

a decomposing mechanism configured to decompose polygons in the layout into edges;

a first contribution-computing mechanism configured to:
represent an edge as a difference between a first line-segment and a second line-segment which overlap at all points except for the points on the edge; and to
compute the edge's contribution to the edge-based proximity correction using the first line-segment and the second line-segment;

a correction-computing mechanism configured to compute the edge-based proximity correction using the edge's contribution;

a region-receiving mechanism configured to receive an interaction region around the evaluation point which identifies a region that contains edges that have non-negligible contributions to the edge-based proximity correction computation;

a selecting mechanism configured to select a set of visible edges within the interaction range which are visible from the evaluation point, wherein the edge-based proximity correction is computed using the set of visible edges, instead of all the edges within the interaction range;

an integrand-receiving mechanism configured to receive an integrand which models an effect of a semiconductor manufacturing process for which the edge-proximity correction is being computed;

a generating mechanism configured to generate a reference line-segment;

a second contribution-computing mechanism configured to compute a contribution value based on the integrand and the reference line-segment, wherein the contribution value represents the reference line-segment's contribution to the edge-proximity correction; and an associating mechanism configured to associate the reference line-segment with the contribution value, thereby allowing a subsequent execution of an edge-based proximity correction process to quickly lookup the reference line-segment's pre-computed contribution value.

14. The apparatus of claim 13, wherein the first contribution-computing mechanism is configured to:

determine a first pre-computed value that represents the first line-segment's contribution to the edge-based proximity correction;

determine a second pre-computed value that represents the second line-segment's contribution to the edge-based proximity correction; and to determine the edge's contribution using the difference between the first pre-computed value and the second pre-computed value.

* * * * *